US008922252B2

(12) United States Patent
Tan et al.

(10) Patent No.: US 8,922,252 B2
(45) Date of Patent: Dec. 30, 2014

(54) THRESHOLD VOLTAGE DEPENDENT POWER-GATE DRIVER

(71) Applicant: Intel Corporation, Santa Clara, CA (US)

(72) Inventors: Hong Yun Tan, Bayan Lepas (MY); Anan S. Deval, Hillsboro, OR (US); R. Kenneth Hose, Wilsonville, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/720,471

(22) Filed: Dec. 19, 2012

(65) Prior Publication Data

US 2014/0168881 A1    Jun. 19, 2014

(51) Int. Cl.
| | | |
|---|---|---|
| H03B 1/00 | (2006.01) |
| H03K 3/00 | (2006.01) |
| H03K 17/16 | (2006.01) |
| H03K 17/30 | (2006.01) |
| G06F 1/16 | (2006.01) |
| H03K 19/00 | (2006.01) |

(52) U.S. Cl.
CPC .............. *G06F 1/16* (2013.01); *H03K 17/163* (2013.01); *H03K 17/302* (2013.01); *H03K 19/0016* (2013.01)
USPC ........... 327/108; 327/109; 327/110; 327/111; 327/112

(58) Field of Classification Search
USPC .................. 327/108, 109; 326/83, 86, 87
See application file for complete search history.

(56) References Cited

U.S. PATENT DOCUMENTS

| | | | | |
|---|---|---|---|---|
| 6,486,816 | B2* | 11/2002 | Seymour ...................... 341/150 |
| 8,044,685 | B2* | 10/2011 | Tsu et al. ........................ 326/83 |
| 2005/0232010 | A1 | 10/2005 | Cernea |
| 2009/0116307 | A1 | 5/2009 | Cottier et al. |
| 2011/0075491 | A1 | 3/2011 | Yun et al. |

OTHER PUBLICATIONS

Notification of Transmittal of the International Search Report and the Written Opinion of the International Searching Authority issued for International Patent Application No. PCT/US2012/071714, mailed Sep. 12, 2013.
Garcia, Jose C., et al., "High Performance Bootstrapped CMOS Low to High-Swing Level-Converter for On-Chip Interconnects," *18th European Conference on Circuit Theory and Design*, pp. 795-798, 2007.
Shrivastava, Aatmesh, et al., "A Charge Pump Based Receiver Circuit for Voltage Scaled Interconnect," *International Symposium on Low Power Electronics and Design*, pp. 327-272, 2012.
Zhang, Hui, et al., "Low-Swing On-Chip Signaling Techniques: Effectiveness and Robustness," *IEEE Transactions on Very Large Scale Integration (VLSI) Systems*, vol. 8, No. 3, pp. 264-272, Jun. 2000.

* cited by examiner

*Primary Examiner* — John Poos
(74) *Attorney, Agent, or Firm* — Blakely, Sokoloff, Taylor & Zafman LLP (57) ABSTRACT

Described is an apparatus which comprises: a first node to provide an un-gated power supply; a second node to provide a threshold dependent supply; an inverter with an input and an output, the inverter coupled to the first and second nodes, the inverter to receive the un-gated power supply at its power supply node, and to receive the threshold dependent supply for supplying ground supply at its ground node; and a transistor with its gate terminal coupled to the output of the inverter, the transistor to provide gated power supply to one or more logic units.

19 Claims, 8 Drawing Sheets

THRESHOLD VOLTAGE DEPENDENT POWER-GATE DRIVER

BACKGROUND

Power-gate transistors are used to provide gated power supply to one or more logic units (e.g., a processor core, memory block, an input-output (I/O) unit, etc). The term "gated power supply" generally refers to power supply which is controlled by a device (e.g., transistor). For example, power supply provided as output by source/drain terminal of a pass-gate when the pass-gate is turned ON is the gated power supply, while the power supply received as input by the drain/source terminal of the power-gate is the un-gated power supply.

Power-gate transistors have a gate terminal which is used to turn on or off the power-gate transistors. An un-gated power supply is provided to one of the terminals (source or drain) of the power-gate transistors and a gated power-supply is provided from the power-gate transistor as output for supplying power to logic units. Power-gate transistors are generally very large because they are designed with the ability to provide power supply to a large logic block of an integrated circuit.

In the case when the gated power supply is substantially close to ground, turning on the power gate causes gated power supply to ramp up. As the gated power supply ramps up, the gated power supply rail experiences di/dt and dv/dt events which may be mistaken for electro-static discharge (ESD) events. In such cases, ESD clamps may turn on and prematurely clamp the gated power supply and inhibit the power supply ramping process for the integrated circuit.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments disclose a threshold voltage dependent power-gate driver that turns on a power-gate slow enough (i.e., weakly) to cause the gated power supply to ramp up without being clamped by an electro-static discharge (ESD) clamp unit. For example, the gated power supply ramps up from ground to its supply level in more than 100 nS. In one embodiment, the threshold voltage dependent power-gate driver includes a circuit to suppress voltage headroom for the driver during the time when the gated power supply is ramping up. For example, the voltage headroom shrinks from a difference between un-gated power supply level and ground to a difference between un-gated power supply level and a threshold voltage above ground. In such an embodiment, the output voltage swing of the threshold voltage dependent power-gate driver is limited between the un-gated power supply level and a threshold voltage above ground.

In one embodiment, the power-gate is initially turned on weakly using threshold voltage instead of a full ground level voltage applied at the gate of the power-gate when the gated power supply is being ramped up. In these embodiments, the power-gate is a p-type device. One technical effect of suppressing the headroom during ramping period of the gated power supply is that the ramp rate of the gated power supply is controlled to be slow enough to not cause an ESD clamp to turn on. In one embodiment, when the gated power supply is close to being ramped up (i.e., close to reaching its nominal supply level), the voltage headroom suppression is removed allowing the power-gate to fully turn on to completely ramp up the gated power supply.

In one embodiment, a digital control unit controls a plurality of threshold voltage dependent power-gate drivers to cause those drivers to turn on a plurality of power-gates in a staggered fashion in time-domain. In one embodiment, the digital control unit comprises a shift-register chain which enables each of the plurality of threshold voltage dependent power-gate drivers to turn on one at a time (or in a staggered fashion) to control overall di/dt and dv/dt of the gated-power supply.

In one embodiment, the threshold voltage dependent power-gate driver receives un-gated power supply as its power supply. In one embodiment, the threshold voltage dependent power-gate driver comprises an inverter with a virtual ground node coupled to a threshold adjusting logic. In one embodiment, the threshold adjusting logic is operable to set the virtual ground node to be at least one threshold voltage above ground level when the threshold voltage dependent power-gate driver is ramping down its output signal which is received by the gate of the power-gate.

In one embodiment, the threshold voltage dependent power-gate driver operates like a normal inverter driver when the output signal has fully or nearly fully turned on the power-gate. In such an embodiment, the threshold adjusting logic adjusts the voltage on the virtual ground node such that it is no longer a threshold above ground level, but is substantially close to (or at) ground level. In one embodiment, pull-up and pull-down keeper devices are engaged (i.e., turned on) to increase driver strength of the threshold voltage dependent power-gate driver when the output signal is at a level to begin fully turning on the power-gate. In one embodiment, the pull-up and pull-down keeper devices are disengaged (i.e., are tri-stated) when the gated power supply is initially being ramped up.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," generally refer to being within +/−20% of a target value.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Transistors may also include Tri-gate transistors and/or FinFETs. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
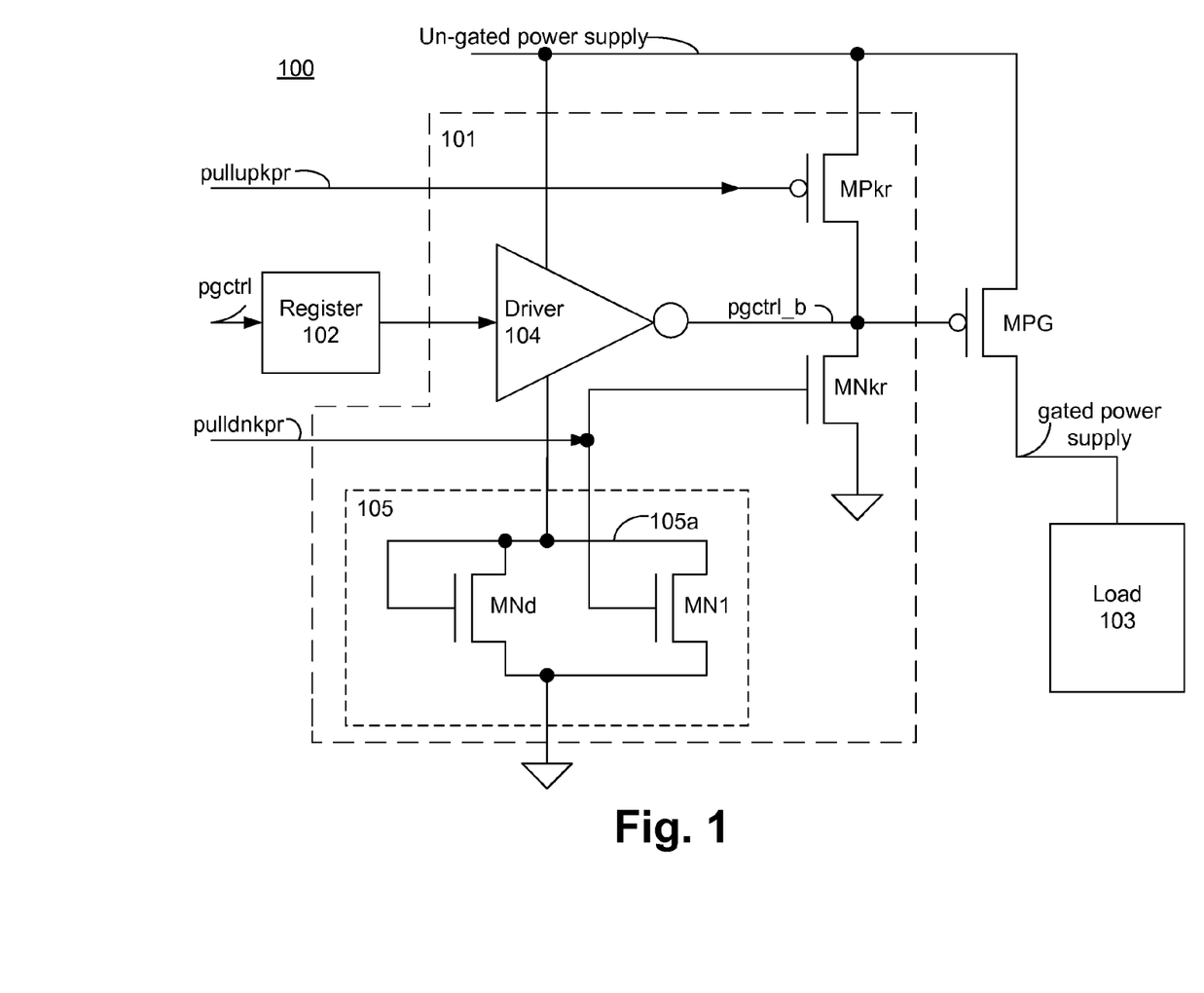
FIG. 1 is a circuit with a threshold voltage dependent power-gate driver, according to one embodiment.

FIG. 1 is a circuit 100 with a threshold voltage dependent power-gate driver, according to one embodiment of the disclosure. In one embodiment, circuit 100 comprises a threshold voltage dependent power-gate driver 101, a register or logic unit 102, a power-gate MPG, and a load 103. In one embodiment, threshold voltage dependent power-gate driver 101, register 102 and power-gate MPG receive un-gated power supply at their supply nodes (also called the first node). In one embodiment, load 103 receives gated power supply from MPG.

In one embodiment, threshold voltage dependent power-gate driver 101 comprises a driver 104, threshold adjusting logic 105, p-type pull-up keeper device MPkr, and n-type pull-down keeper device MNkr. In one embodiment, driver 104 is an inverter (or buffer) comprising a p-type device coupled in series with an n-type device, where source terminal of the p-type device is coupled to the un-gated power supply node while the source terminal of the n-type device is coupled to a virtual ground node (also called the second supply node) 105a. In one embodiment, output of driver 104 is coupled to the gate terminal of the power-gate MPG.

In one embodiment, threshold adjusting logic 105 comprises a diode connected n-type device MNd coupled in parallel to another n-type device MN1. In one embodiment, source terminals of MNd and MN1 are coupled to ground node while their drain terminals are coupled to node 105a. In one embodiment, MN1 is controlled by pulldnkpr signal (also called second signal) which also controls pull-down keeper device MNkr. In one embodiment, pull-up keeper device MPkr is controlled by pullupkpr signal (also called first signal). The generation of pullupkpr, pulldnkpr, and pgctrl signals is discussed with reference to FIG. 2. In one embodiment, during initial ramp up of gated power supply, pullupkpr and pulldnkpr are set to cause MPkr and MNkr to be in tri-stated condition.

Referring back to FIG. 1, in one embodiment, register 102 is a latch or a buffer which provides pgctrl signal as input to driver 104. In one embodiment, driver 104 generates pgctrl_b (logical inverse of pgctrl) with a controlled ramp to control turn on (and/or off) behavior of MPG. In one embodiment, when the gated power supply is being ramped up and MPG is beginning to turn on weakly, MN1 is off. In such an embodiment, MNd of the threshold adjusting logic 105 causes the virtual ground node 105a to be a threshold voltage (Vth) above ground. In this embodiment, the threshold voltage is the threshold voltage of MNd which is diode connected.

In such an embodiment, driver 104 operates with suppressed headroom between un-gated power supply and virtual ground node 105a which is a threshold voltage above ground. For example, if the threshold voltage of MNd is 0.3V and un-gated power supply is 1.0V, then driver 104 is forced to operate with headroom of 0.7V (1.0V-0.3V). By suppressing the headroom, the voltage swing of pgctrl_b is between threshold voltage of MNd and un-gated power supply. For example, the voltage swing of pgctrl_b is 0.7V (relative to 0V) instead of 1.0V. One technical non-limiting effect of suppressed headroom during ramp up of gated power supply is that MPG turns on weakly causing gated power supply to ramp up slow enough to not engage any ESD clamp to clamp the gated power supply.

As pgctrl_b falls from un-gated power supply level to threshold voltage level of MNd and pgctrl_b reaches close to the threshold voltage level of MNd, MPkr and MNkr are engaged such that MNkr is turned on while MPkr remains off. In such an embodiment, MN1 turns on which removes the suppression of the operating headroom i.e., 105a now becomes at ground level instead of a threshold voltage above ground level. In this embodiment, MPG is fully turned on and gated power supply level is allowed to become substantially the same as un-gated power supply level. In one embodiment, when MPG is turned off, MPkr is turned on and MNkr is turned off. In such an embodiment, MPkr assists with fast turn off of MPG.

In one embodiment, load 103 is at least one of an input-output (I/O) buffer (or driver) with an electro-static discharge (ESD) unit; a processor core; a memory controller; or cache memory, etc. In one embodiment, the I/O buffer is a double data rate (DDR) compliant I/O (e.g., DDR3, DDR4, etc). In other embodiments, other types of I/O buffers may be used.

Figure 2:
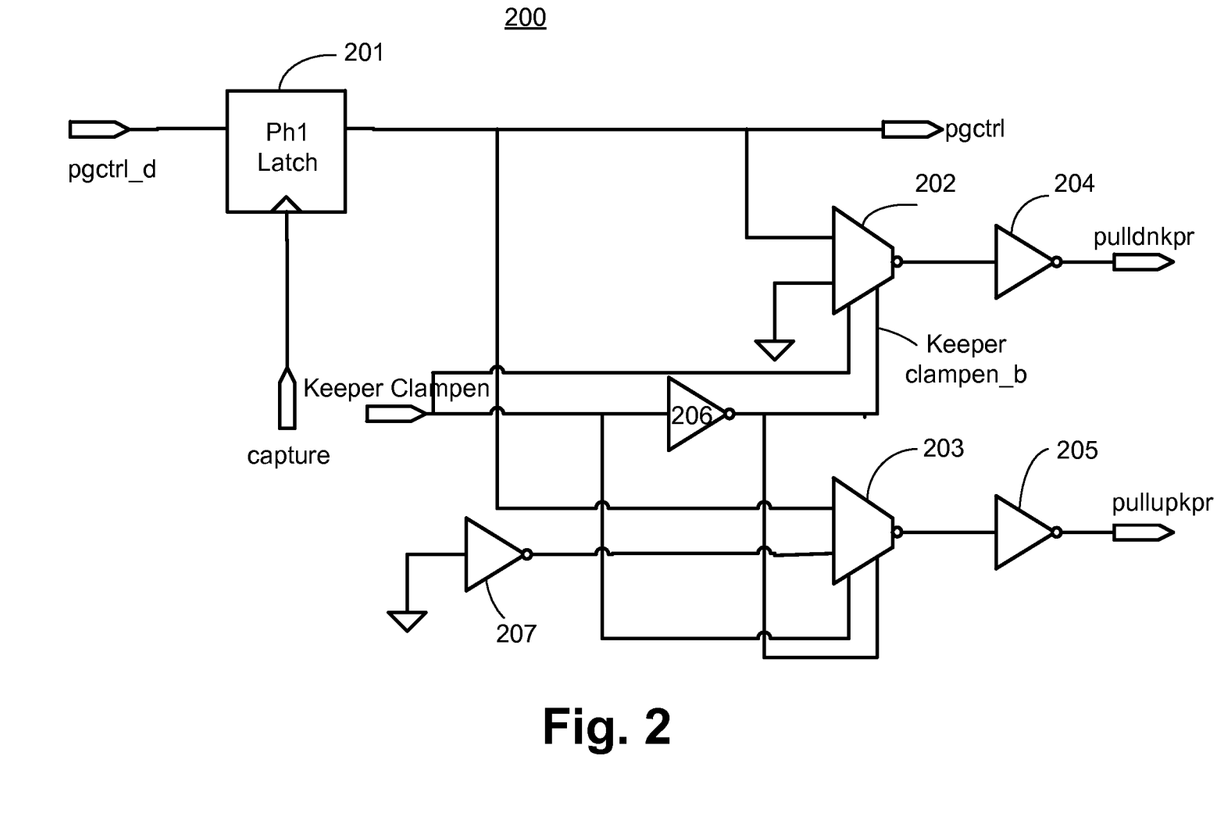
FIG. 2 is a control logic unit for controlling the threshold voltage dependent power-gate driver, according to one embodiment.

FIG. 2 is a control logic unit 200 for controlling the threshold voltage dependent power-gate driver, according to one embodiment of the disclosure. It is pointed out that those elements of FIG. 2 having the same reference numbers (or names) as the elements of any other figure can operate or function in any manner similar to that described, but are not limited to such.

In one embodiment, control unit 200 comprises a latch 201, multiplexers 202 and 203, and inverters 204, 205, 206, and 207. Control unit 200 is one exemplary embodiment to generate signals pgctrl, pulldnkpr, and pullupkpr for circuit 100. Other circuits using different logic units to achieve the same logic function as control unit 200 may be used.

In this embodiment, "Keeper clampen" is a signal for enabling or disabling the pull-up and pull-dn kickers MPkr and MNkr, and "capture" is a signal to make latch 201 transparent or to block it for debug purposes (for example). Signal "Keeper clampen_b" is the logical inverse of "Keeper clampen." In normal mode, latch 201 is a transparent latch. In one embodiment, latch 201 is removed and output from another logic which generates pgctrl_d (which is logically equivalent to pgctrl) is provided directly to the node pgctrl for driver 104.

In one embodiment, the function of control unit 200 is to cause MPkr and MNkr to be tri-stated when gated power supply is being ramped up. In such an embodiment, select signal of multiplexers 202 and 203 select ground and logical high (un-gated power supply level) as their outputs which cause MPkr and MNkr to be tri-stated. In one embodiment, once gated power supply level is close to being fully ramped up, multiplexers 202 and 203 select pgctrl as output to control MPkr and MNkr which causes MPkr to turn off and MNkr to turn on. In one embodiment, when MPG is being turned off, multiplexers 202 and 203 select pgctrl as output to control MPkr and MNkr which causes MPkr to turn on and MNkr to turn off.

Figure 3A:
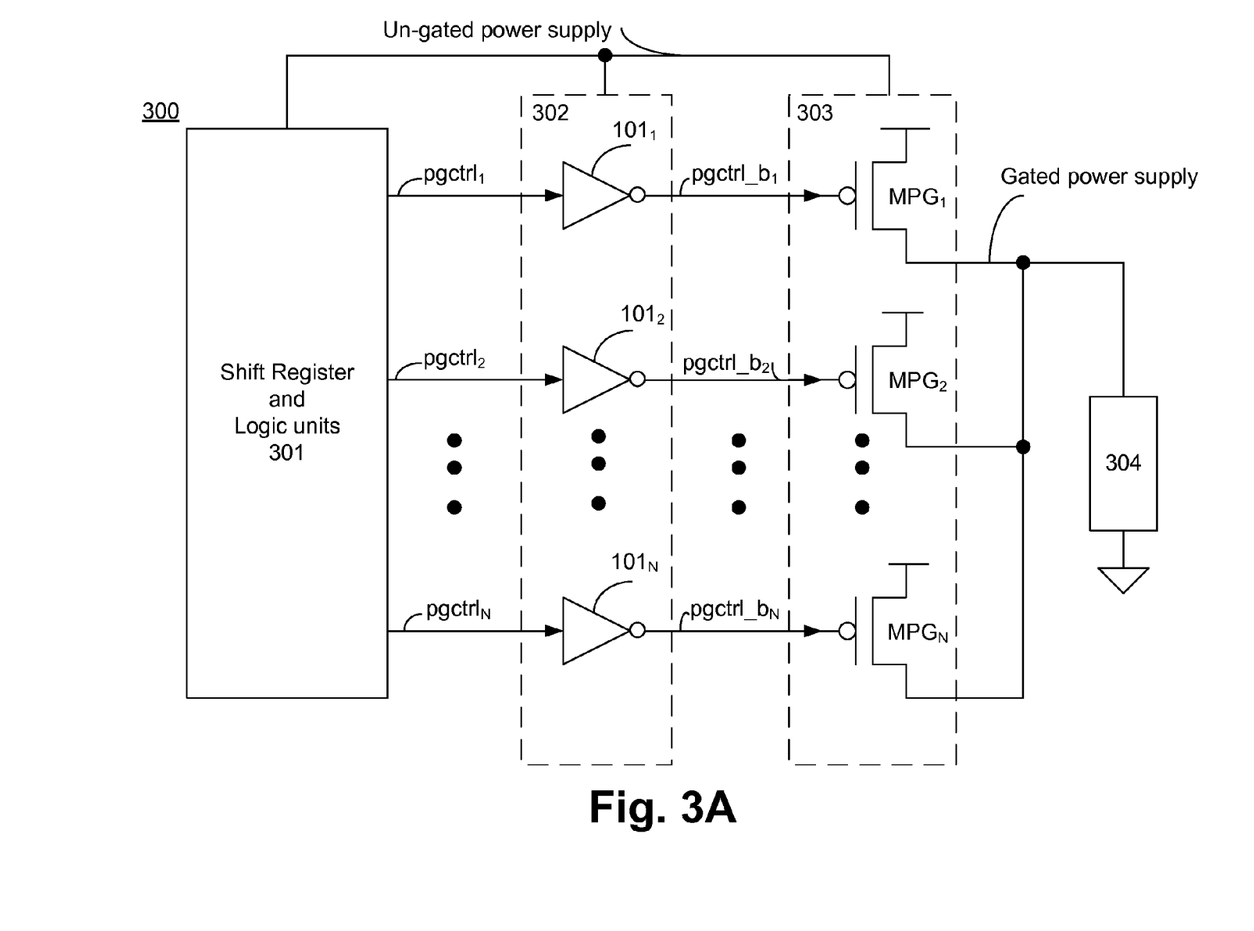
FIG. 3A is a circuit illustrating plurality of threshold voltage dependent power-gate drivers controlled by a shift-register, according to one embodiment.

FIG. 3A is a circuit 300 illustrating plurality of threshold dependent power-gate drivers controlled by a shift-register, according to one embodiment of the disclosure. It is pointed out that those elements of FIG. 3A having the same reference numbers (or names) as the elements of any other figure can operate or function in any manner similar to that described, but are not limited to such.

In one embodiment, circuit 300 comprises a shift register chain and logic units 301, a plurality of threshold voltage dependent drivers 302, and plurality of power-gates 303, and load 304. In one embodiment, shift register chain and logic units 301 provide pgctrl$_{1-N}$ signals to each (101$_{1-N}$, where 'N' is an integer greater than 1) of the plurality of threshold voltage dependent drivers 302. The outputs of the plurality of threshold voltage dependent drivers 302 are pgctrl_b$_{1-N}$ which drive the power-gates MPG$_{1-N}$, where 'N' is an integer greater than 1. In one embodiment, the function of the shift register chain and logic units 301 is to turn on and off MPG$_{1-N}$ (of 303) one at a time via the a plurality of threshold voltage dependent drivers 302, so that the gated power supply to load 304 ramps up slowly (i.e., slow enough to not cause any ESD clamp to clamp the gated power supply).

Figure 3B:
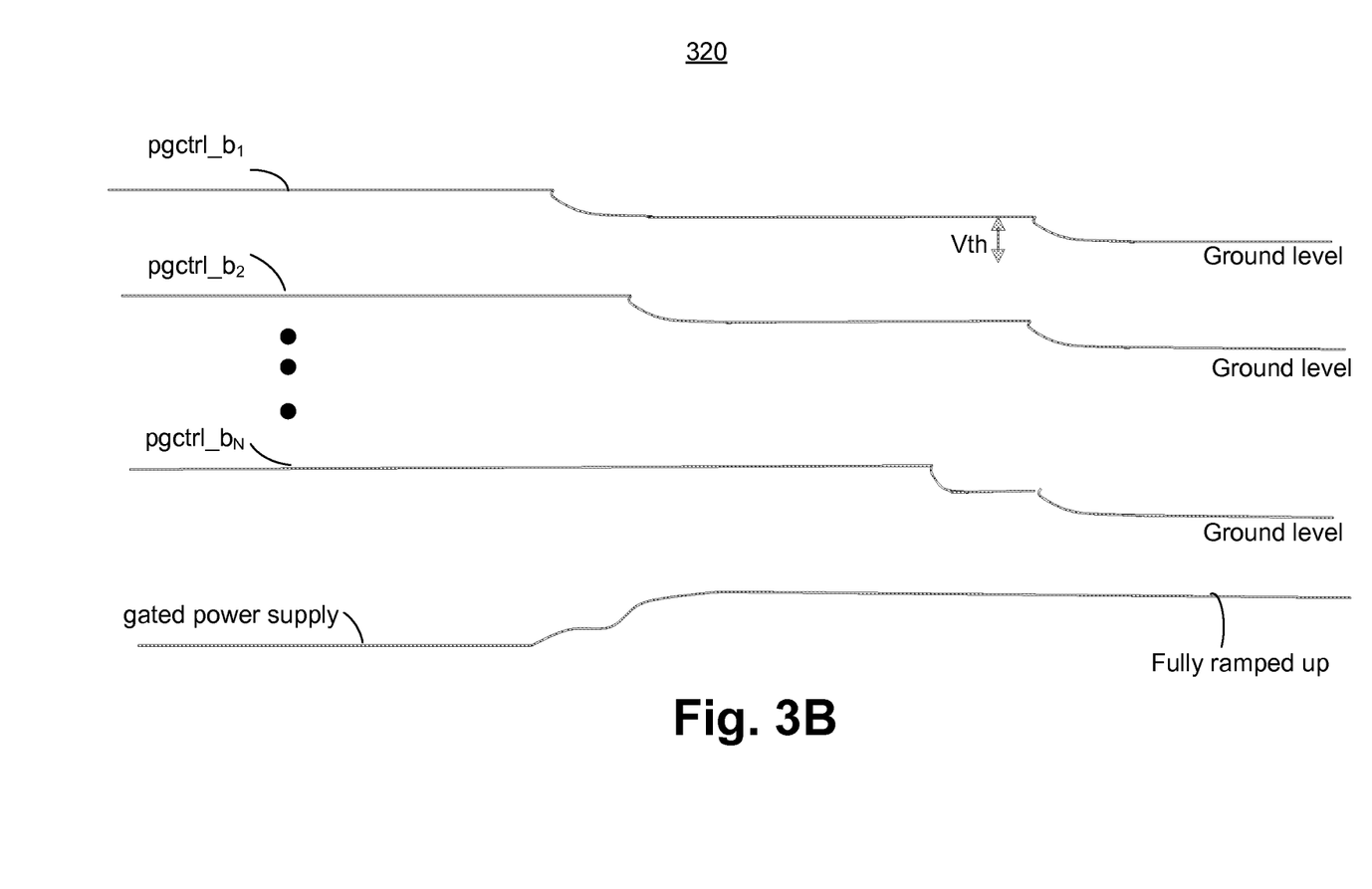
FIG. 3B are output waveforms of the plurality of threshold voltage dependent power-gate drivers to turn on a plurality of power-gates, according to one embodiment.

FIG. 3B are output waveforms 320 of the plurality of threshold dependent power-gate drivers to turn on a plurality of power-gates, according to one embodiment. It is pointed out that those elements of FIG. 3B having the same reference numbers (or names) as the elements of any other figure can operate or function in any manner similar to that described, but are not limited to such.

The waveforms illustrate the timing of pgctrl_b$_{1-N}$ signals which drive the power-gates MPG$_{1-N}$. In one embodiment, shifter-register 301 generates pgctrl$_{1-N}$ signals for the plurality of threshold voltage dependent voltage drivers 101$_{1-N}$ in a staggered fashion in time domain. In one embodiment, threshold voltage dependent voltage drivers 101$_{1-N}$ generate pgctrl_b$_{1-N}$ signals which are also in staggered fashion in time domain. In one embodiment, threshold dependent voltage drivers 101$_{1-N}$ suppress the headroom of the drivers by raising the virtual ground level to be a threshold voltage above ground. The suppressed headroom allows threshold dependent voltage drivers 101$_{1-N}$ to weakly turn on the respective power-gates so that any ESD clamp monitoring the gated power supply does not clamp the gated power supply when the gated power supply is being ramped up (i.e., does not mistake the ramp of the gated power supply for an ESD event).

Figure 3C:
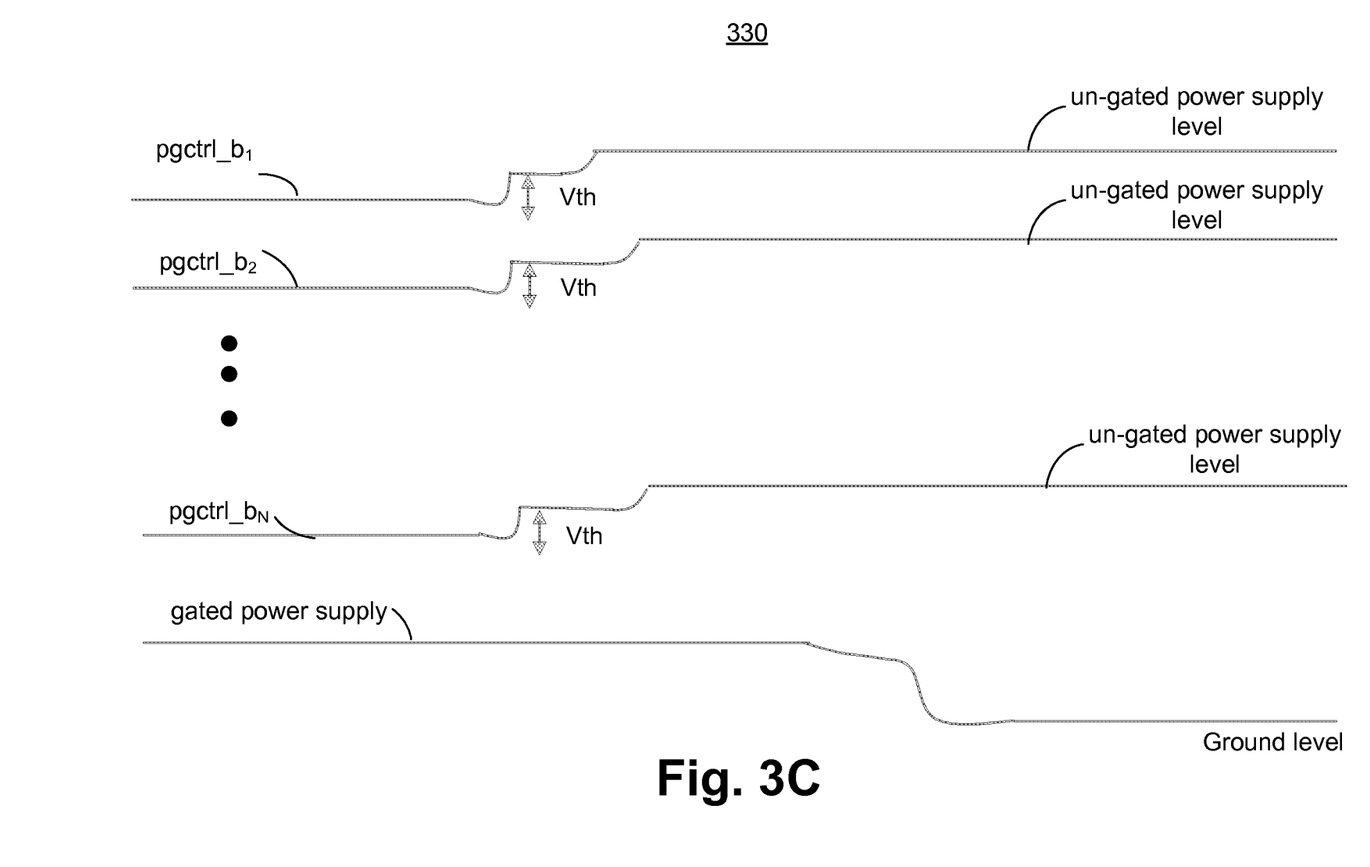
FIG. 3C are output waveforms of the plurality of threshold dependent power-gate drivers to turn off the plurality of power-gates, according to one embodiment.

FIG. 3C are output waveforms 330 of the plurality of threshold dependent power-gate drivers to turn off the plurality of power-gates, according to one embodiment. It is pointed out that those elements of FIG. 3C having the same reference numbers (or names) as the elements of any other figure can operate or function in any manner similar to that described, but are not limited to such.

The waveforms of FIG. 3C are similar to the waveforms of FIG. 3B, but are used for turning off the power-gates. The waveforms illustrate the timing of pgctrl_b$_{1-N}$ signals which drive the power-gates MPG$_{1-N}$. The shifter-register 301 generates pgctrl$_{1-N}$ signals for the plurality of threshold dependent voltage drivers 101$_{1-N}$ in a staggered fashion in time domain. In one embodiment, threshold voltage dependent voltage drivers 101$_{1-N}$ generate pgctrl_b$_{1-N}$ signals which are also in a staggered fashion in time domain. In one embodiment, threshold dependent voltage drivers 101$_{1-N}$ suppresses the headroom of the drivers by raising the virtual ground level to be a threshold voltage above ground. The suppressed headroom allows threshold voltage dependent voltage drivers 101$_{1-N}$ to weakly turn off the respective power-gates so that any ESD clamp monitoring the gated power supply does not clamp the gated power supply when the gated power supply is being ramped down.

Figure 4:
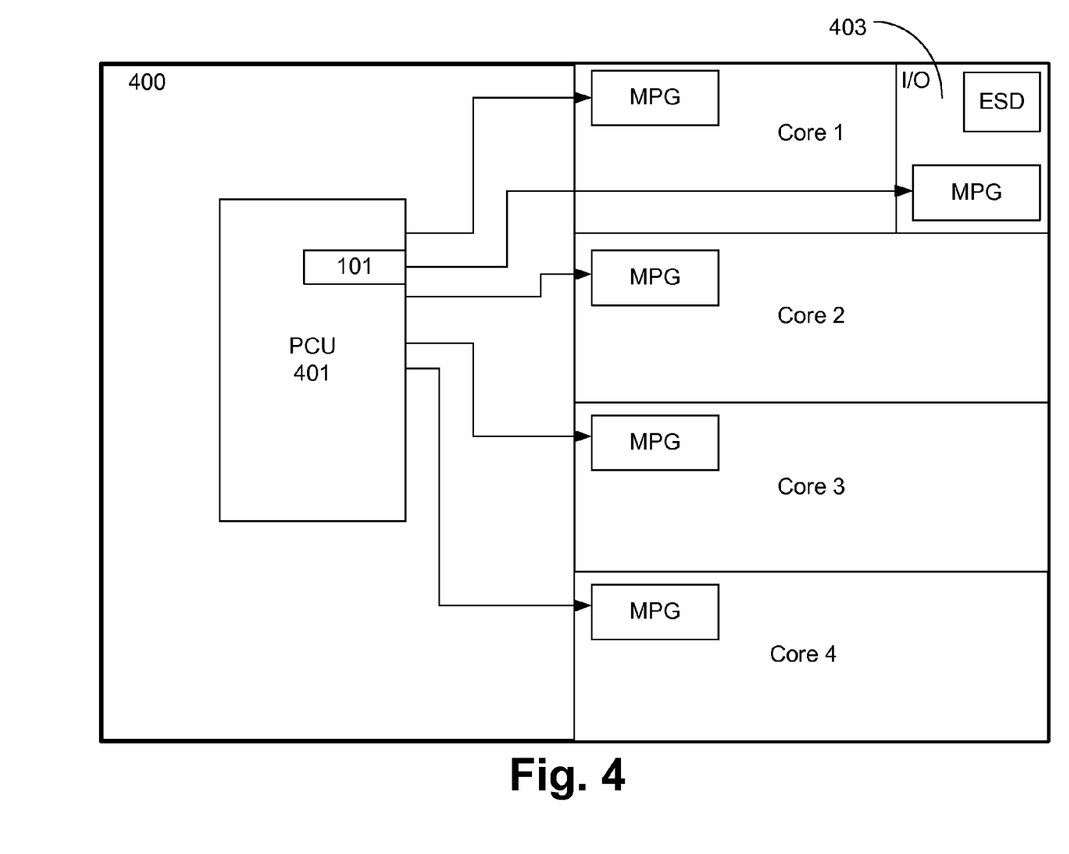
FIG. 4 is a processor with a power control unit for controlling the threshold dependent power-gate drivers and power-gates, according to one embodiment.

FIG. 4 is a processor 400 with a power control unit (PCU) for controlling the threshold dependent power-gate drivers and power-gates, according to one embodiment of the disclosure. It is pointed out that those elements of FIG. 4 having the same reference numbers (or names) as the elements of any other figure can operate or function in any manner similar to that described, but are not limited to such.

In one embodiment, processor 400 comprises a PCU 401, multiple processing cores (e.g., cores 1-4), and I/O buffer (or driver) 403 in each core. In one embodiment, PCU 401 comprises threshold voltage dependent driver 101 that drive respective power gates. While the embodiment shows the threshold voltage dependent driver 101 to be integrated in the PCU 401, the threshold voltage dependent driver 101 may be physically coupled to the MPG and may reside next to their respective MPGs. In this embodiment, each processing core has its own MPG to control power supply to that core.

In one embodiment, I/O buffer 403 comprises its own MPG and ESD unit. In one embodiment, threshold voltage dependent driver 101 ramps up gated power supply for MPG in I/O buffer 403 such that the ESD unit does not clamp the gated power supply. In one embodiment, I/O buffer 403 is DDR4 compliant I/O driver. In other embodiments, other types of I/O buffers may be used.

Figure 5:
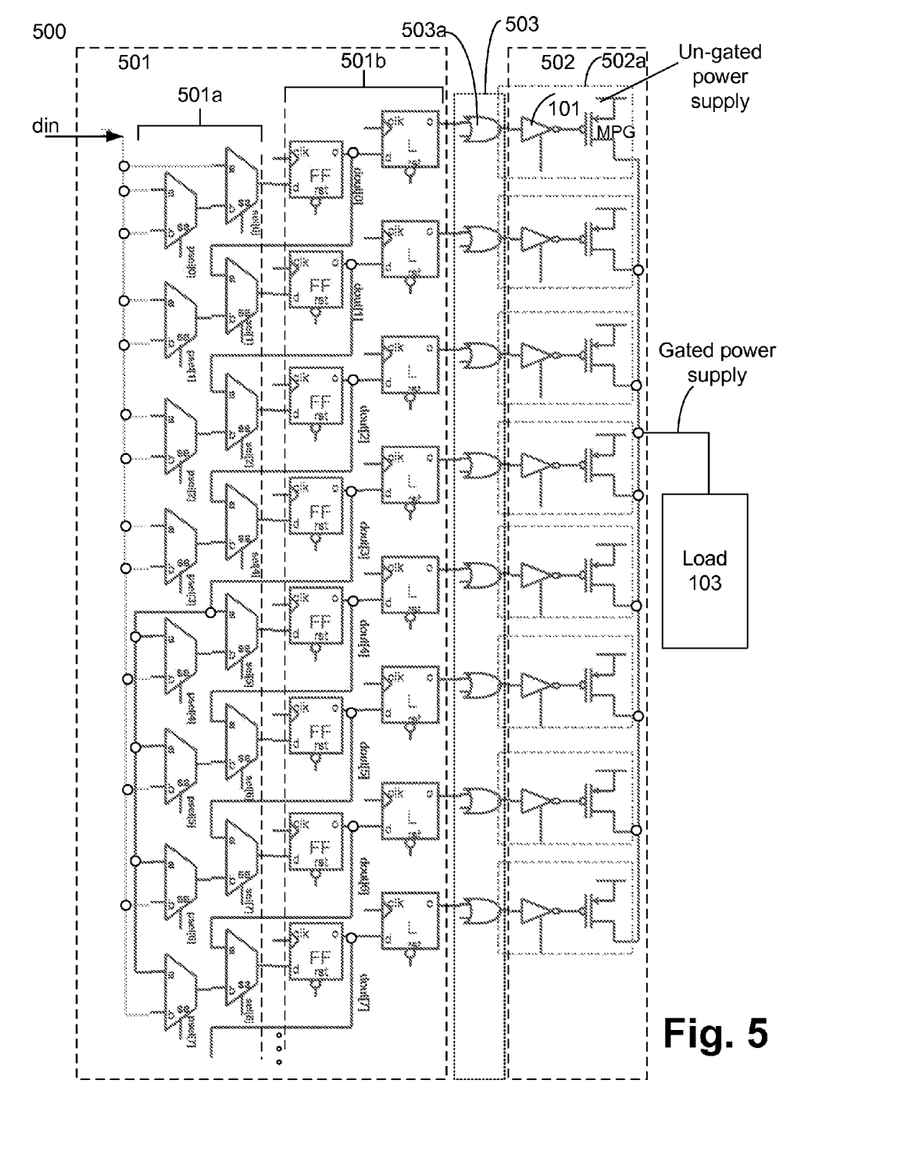
FIG. 5 illustrates a circuit 500 with local threshold dependent power-gate drivers for corresponding power-gates, and shift register based control unit, according to one embodiment.

FIG. 5 illustrates a circuit 500 with local threshold dependent power-gate drivers for corresponding power-gates, and a shift register based control unit, according to one embodiment of the disclosure. It is pointed out that those elements of FIG. 5 having the same reference numbers (or names) as the elements of any other figure can operate or function in any manner similar to that described, but are not limited to such.

In one embodiment, circuit 500 comprises scan chain (or shift register chain) 501, threshold voltage dependent driver and corresponding power-gate 502, gating logic 503, and load 103. The embodiment, of FIG. 5 is a detailed version of the embodiment of FIG. 3. In this embodiment, shift register chain 501 is illustrated which receives an input data din and generates control signals for each threshold voltage dependent driver. In this embodiment, threshold voltage dependent driver is closely (physically) coupled to the respective power-gate. For example, 502a illustrates a pair of threshold voltage dependent drivers 101 and corresponding MPGs to provide gated power supply to load 103.

In one embodiment, shift-register chain (or shift-registers) 501 slowly shifts in control signal (pgctrl) to different threshold voltage dependent drivers (e.g., 101) to turn on more and more groups of power-gates MPGs to slowly ramp up gated power supply for load 103. In one embodiment, shift-register chain 501 comprises a plurality of multiplexers 501a and shift registers 501b to control the turning on/off of the threshold voltage dependent drivers (e.g., 101) in order to control the overall size of the MPG needed to be turned on/off. The gradual turn on/off of MPGs adjusts the dv/dt and di/dt on the gated power supply rail. In one embodiment, shift-register chain 501 allows for digital control of dv/dt and di/dt on the gated power supply rail. In one embodiment, plurality of multiplexer 501a is coupled together in such a way to be able to speed up the total cycle of latency to fully turn on/off the MPG through the driver circuit (e.g., 101 in 502).

In one embodiment, the select line (input to the multiplexers) for multiplexers 501a is operable to provide setting of latency (e.g., four settings) for turning on/off drivers in 502. In one embodiment, the first setting for the select line sets up a slowest shift-register chain 501 to turn on one driver at a time. In one embodiment, the second setting for the select line sets up shift-register chain 501 to turn on two drivers (two of 101s in 502) at a time. In one embodiment, the third setting for the select line sets up shift-register chain 501 to turn on four drivers (four of 101s in 502) at a time. In one embodiment, the fourth setting for the select line sets up shift-register chain 501 to turn on eight drivers (eight of 101s in 502) at a time.

In one embodiment, gating logic 503 provides a debug feature to the gradual turn on/off of the MPGs in 502. In one embodiment, gating logic 503 comprises NOR logic gates (e.g., 503a) that receive output of shift-register chain 501 and propagate that output to the drivers (e.g., 101 of 502) to turn on/off MPGs. In one embodiment, the feature of gradual turn on/off of the MPGs can be disabled by another input of the NOR logic gate (or a functionally similar logic gate). In one embodiment, the function of the shift-register 501 is bypassed by the other input to the NOR logic gate. In one embodiment, NOR logic gate may be replaced by any other logic gate to cause the same effect.

Figure 6:
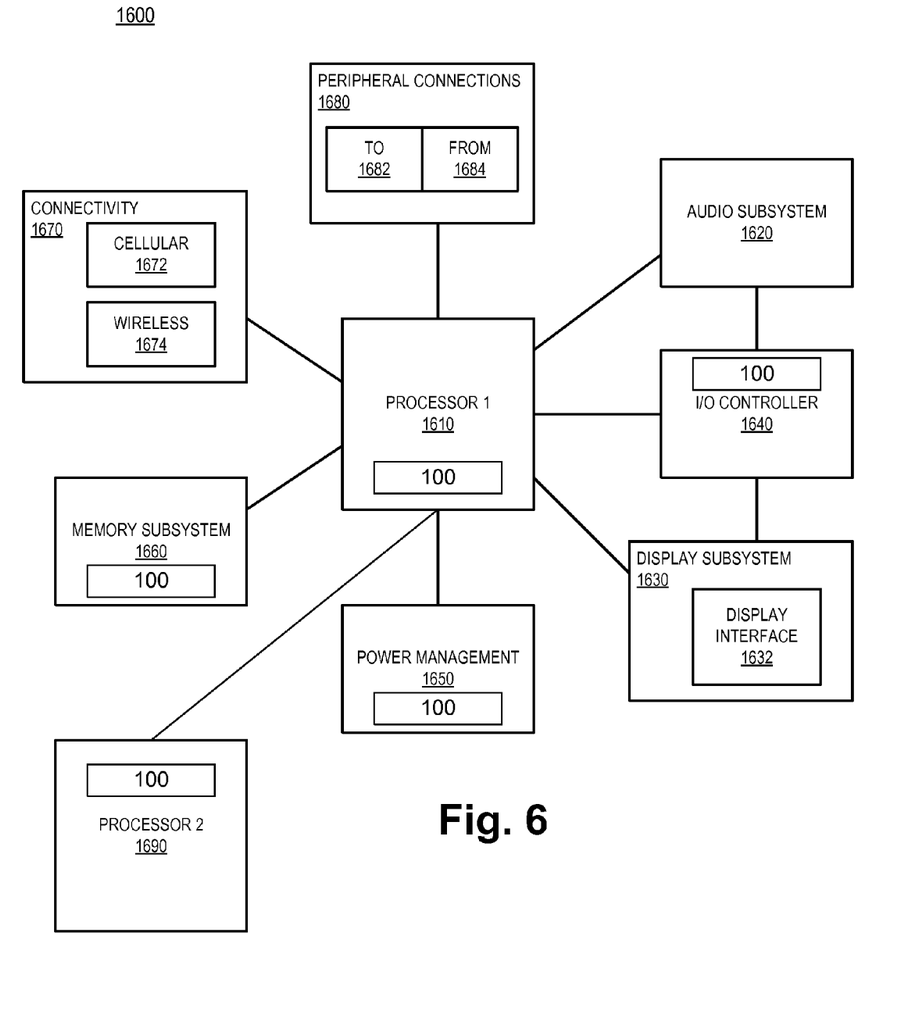
FIG. 6 is a smart device or a computer system of SOC (System-on-chip) with the threshold voltage dependent power-gate driver, according to one embodiment.

FIG. 6 is a smart device 1600 or a computer system or SOC (System-on-chip) with the threshold dependent power-gate driver, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the threshold dependent power-gate driver 101 (or integrated circuit 100) of FIG. 1, and a second processor 1690 with the threshold dependent power-gate driver 101 (or integrated circuit 100) of FIG. 1, according to the embodiments discussed herein. Other blocks of the computing device with I/O drivers may also include the threshold dependent power-gate driver 101 (or integrated circuit 100) of FIG. 1. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description.

For example, the headroom may be suppressed for un-gated power supply and ground instead of just raising the ground level to a threshold above ground. In one embodiment, the power-gate comprises a p-type and n-type device (like a pass-gate). In such an embodiment, driver 104 is used to control the turn on behavior of the p-type pass-gate transistor as discussed above, while another driver is used to control the turning on behavior of the n-type pass-gate transistor. In such an embodiment, the other driver has a virtual un-gated power supply node which is one threshold below the un-gated power supply level when the n-type power-gate is being slowly (i.e., weakly) turned on. In one embodiment, a p-type diode connected device is used to provide a threshold below un-gated power supply to the other driver. In such an embodiment, MPkr coupled to the other driver's output node is turned on to fully turn on the n-type power-gate transistor when the gated power supply is close to being completely ramped up. In one embodiment, when the power-gate is being turned on and gated power supply is being ramped up, the effective headroom for the drivers (driver 104 and the other driver) is (un-gated power supply−Vtp) minus (ground+Vtn).

The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a first node to provide an un-gated power supply; a second node to provide a threshold dependent supply; an inverter (or buffer) with an input and an output, the inverter coupled to the first and second nodes, the inverter to receive the un-gated power supply at its power supply node, and to receive the threshold dependent supply for supplying ground supply at its ground node; and a transistor with its gate terminal coupled to the output of the inverter, the transistor to provide gated power supply to one or more logic units.

In one embodiment, the second node is coupled to a diode connected n-type device and a controllable n-type device. In one embodiment, the diode connected n-type device has a source terminal coupled to a ground node, and wherein the controllable n-type device has a source terminal coupled to the ground node. In one embodiment, the apparatus further comprises: an n-type kicker device coupled to the output of the inverter and a ground node, wherein the n-type kicker device is controllable by a second signal. In one embodiment, the controllable n-type kicker device is controllable by the second signal which is different from the first signal.

In one embodiment, the apparatus further comprises: a p-type kicker device coupled to the output of the inverter and the first node, wherein the p-type kicker device is controllable by a first signal. In one embodiment, the transistor is a power-gate transistor coupled to the first node to receive the un-gated power supply at one of its terminals. In one embodiment, the input of the inverter is driven by an output of a register of a shift-register chain.

In one embodiment, the one or more logic units include at least one of: an input-output (I/O) with an electro-static discharge (ESD) unit; a processor core; a memory controller; or cache memory.

In another example, an apparatus comprises a plurality of power-gate devices, coupled to a first node providing un-gated power supply, the plurality of power-gate devices operable to provide gated power supply to one or more logic units; a second node to provide a threshold dependent supply; a plurality of buffers to drive the plurality of power-gate device; and a shift-register chain to generate a plurality of drive signals for the plurality of buffers, wherein the plurality of buffers includes a buffer with an input and an output, the buffer coupled to the first and second nodes, the buffer to receive the un-gated power supply at its power supply node, and to receive the threshold dependent supply for supplying ground supply at its ground node.

In one embodiment, the second node is coupled to a diode connected n-type device and a controllable n-type device. In one embodiment, the diode connected n-type device has a source terminal coupled to a ground node, and wherein the controllable n-type device has a source terminal coupled to the ground node.

In one embodiment, the apparatus further comprises: an n-type kicker device coupled to the output of the buffer and a ground node, the n-type kicker device controllable by a second signal, wherein the controllable n-type device is controllable by the second signal. In one embodiment, the shift-register chain to generate the plurality of drive signals in a staggered manner in time-domain to provide the plurality of drive signals to the plurality of buffers one at a time.

In one embodiment, the one or more logic units include at least one of: an input-output (I/O) with an electro-static discharge (ESD) unit; a processor core; a memory controller; or cache memory.

In another example, a system comprises: a memory unit; and a processor, coupled to the memory unit, the processor having an input-output (I/O) driver with an electro-static discharge (ESD) unit, the processor comprising: a first node to provide an un-gated power supply; a second node to provide a threshold dependent supply; a buffer with an input and an output, the inverter coupled to the first and second nodes, the buffer to receive the un-gated power supply at its power supply node, and to receive the threshold dependent supply for supplying ground supply at its ground node; and a transistor with its gate terminal coupled to the output of the buffer, the transistor to provide gated power supply to the I/O driver without causing the ESD unit to clamp the gated power supply.

In one embodiment, the second node is coupled to a diode connected n-type device and a controllable n-type device. In one embodiment, the diode connected n-type device has a source terminal coupled to a ground node, and wherein the controllable n-type device has a source terminal coupled to the ground node. In one embodiment, the processor further comprises: an n-type kicker device coupled to the output of the buffer and the ground node, the n-type kicker device controllable by a second signal, wherein the controllable n-type kicker device is controllable by the second signal; and a p-type kicker device coupled to the output of the buffer and the first node, the p-type kicker device controllable by a first signal, the first signal being different from the second signal. In one embodiment, the system further comprises: a wireless interface for allowing the processor to communicate with another device; and a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first node to provide an un-gated power supply;
a second node to provide a threshold dependent supply;
a driver with an input and an output, the driver coupled to the first and second nodes, the driver to receive the un-gated power supply at its power supply node, and to receive the threshold dependent supply at its reference node; and a transistor with its gate terminal coupled to the output of the driver, the transistor to provide gated power supply to one or more logic units, wherein the transistor is a power-gate transistor coupled to the first node to receive the un-gated power supply at one of its terminals.

2. The apparatus of claim 1, wherein the second node is coupled to a diode connected n-type device and a controllable n-type device.

3. The apparatus of claim 2, wherein the diode connected n-type device has a source terminal coupled to a ground node, and wherein the controllable n-type device has a source terminal coupled to the ground node.

4. The apparatus of claim 2 further comprises:
an n-type kicker device coupled to the output of the driver and a ground node, wherein the n-type kicker device is controllable by a signal.

5. The apparatus of claim 4, wherein the signal is different than an input signal that is receivable at the input of the driver.

6. The apparatus of claim 1 further comprises:
a p-type kicker device coupled to the output of the inverter and the first node, wherein the p-type kicker device is controllable by a signal.

7. The apparatus of claim 1, wherein the input of the driver is driven by an output of a register of a shift-register chain.

8. The apparatus of claim 1, wherein the one or more logic units include at least one of:
an input-output (I/O) with an electro-static discharge (ESD) unit;
a processor core;
a memory controller; or
cache memory.

9. An apparatus comprising:
a plurality of power-gate devices coupled to a first node, the first node to provide an un-gated power supply, the plurality of power-gate devices to provide a gated power supply to one or more logic units;
a second node to provide a threshold dependent supply;
a plurality of drivers to drive the plurality of power-gate devices; and
a shift-register chain to generate a plurality of drive signals for the plurality of drivers,
wherein the plurality of drivers includes a driver with an input and an output, the driver coupled to the first and second nodes, the driver to receive the un-gated power supply at its power supply node, and to receive the threshold dependent supply at its reference node.

10. The apparatus of claim 9, wherein the second node is coupled to a diode connected n-type device and a controllable n-type device.

11. The apparatus of claim 10, wherein the diode connected n-type device has a source terminal coupled to a ground node, and wherein the controllable n-type device has a source terminal coupled to the ground node.

12. The apparatus of claim 11 further comprises:
an n-type kicker device coupled to the output of the driver and a ground node, the n-type kicker device controllable by a signal.

13. The apparatus of claim 9, wherein the shift-register chain is to generate the plurality of drive signals in a staggered manner in the time-domain to provide the plurality of drive signals to the plurality of drivers one at a time.

14. The apparatus of claim 9, wherein the one or more logic units include at least one of:
an input-output (I/O) with an electro-static discharge (ESD) unit;
a processor core;
a memory controller; or
cache memory.

15. A system comprising:
a memory unit; and
a processor coupled to the memory unit, the processor having an input-output (I/O) driver with an electro-static discharge (ESD) unit, the processor comprising:
a first node to provide an un-gated power supply;
a second node to provide a threshold dependent supply;
a driver with an input and an output, the driver coupled to the first and second nodes, the driver to receive the un-gated power supply at its power supply node, and to receive the threshold dependent supply at its reference node; and
a transistor with its gate terminal coupled to the output of the driver, the transistor to provide gated power supply to the I/O driver without causing the ESD unit to clamp the gated power supply.

16. The system of claim 15, wherein the second node is coupled to a diode connected n-type device and a controllable n-type device.

17. The system of claim 16, wherein the diode connected n-type device has a source terminal coupled to a ground node, and wherein the controllable n-type device has a source terminal coupled to the ground node.

18. The system of claim 17, wherein the processor further comprises:
an n-type kicker device coupled to the output of the driver and the ground node, the n-type kicker device controllable by a first signal; and
a p-type kicker device coupled to the output of the driver and the first node, the p-type kicker device controllable by a second signal, the first signal being different from the second signal.

19. The system of claim 15 further comprises:
a wireless interface for allowing the processor to communicate with another device; and
a display unit.

* * * * *

UNITED STATES PATENT AND TRADEMARK OFFICE
CERTIFICATE OF CORRECTION

| | | |
|---|---|---|
| PATENT NO. | : 8,922,252 B2 | Page 1 of 1 |
| APPLICATION NO. | : 13/720471 | |
| DATED | : December 30, 2014 | |
| INVENTOR(S) | : Tan et al. | |

It is certified that error appears in the above-identified patent and that said Letters Patent is hereby corrected as shown below:

On the Title page, item 72, delete, "Anan S. Deval" and insert -- Anant S. Deval --.

Signed and Sealed this
Twenty-first Day of April, 2015

Michelle K. Lee
*Director of the United States Patent and Trademark Office*